(12) United States Patent
Lehr et al.

(10) Patent No.: US 6,455,435 B1
(45) Date of Patent: Sep. 24, 2002

(54) METHOD FOR FABRICATING A WIRING PLANE ON A SEMICONDUCTOR CHIP WITH AN ANTIFUSE

(75) Inventors: Matthias Lehr; Wolfgang Leiberg, both of Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/839,765

(22) Filed: Apr. 20, 2001

(30) Foreign Application Priority Data

Apr. 20, 2000 (DE) .......................................... 100 21 098

(51) Int. Cl.[7] ............................................. H01L 21/314
(52) U.S. Cl. ........................ 438/694; 438/700; 438/720
(58) Field of Search ................. 438/600, 601, 438/637, 694, 700, 720, 622

(56) References Cited

U.S. PATENT DOCUMENTS

| 5,308,795 A | | 5/1994 | Hawley et al. | ...... 148/DIG. 55 |
| 5,404,029 A | * | 4/1995 | Husher et al. | .................. 257/50 |
| 5,441,914 A | * | 8/1995 | Taft et al. | .............. 148/DIG. 1 |
| 5,464,790 A | | 11/1995 | Hawley | ........................ 438/600 |
| 5,578,836 A | * | 11/1996 | Husher et al. | .................. 257/50 |
| 5,602,053 A | | 2/1997 | Zheng et al. | ................. 257/355 |
| 5,633,189 A | | 5/1997 | Yen et al. | ..................... 438/600 |
| 5,770,885 A | * | 6/1998 | McCollum et al. | ........... 257/50 |
| 6,124,194 A | * | 9/2000 | Shao et al. | .................. 257/529 |

* cited by examiner

Primary Examiner—Benjamin L. Utech
Assistant Examiner—Kin-Chan Chen
(74) Attorney, Agent, or Firm—Laurence A. Greenberg; Werner H. Stemer; Ralph E. Locher

(57) ABSTRACT

A method for fabricating a wiring plane with antifuses is described. During the fabrication of the wiring plane on a semiconductor chip with the antifuses, provision is made of a buried antireflection layer in a dielectric layer. In the dielectric layer contact holes are formed, as a result of which only one etching step has to be carried out for the photolithography for forming interconnect trenches above the contact holes.

6 Claims, 3 Drawing Sheets

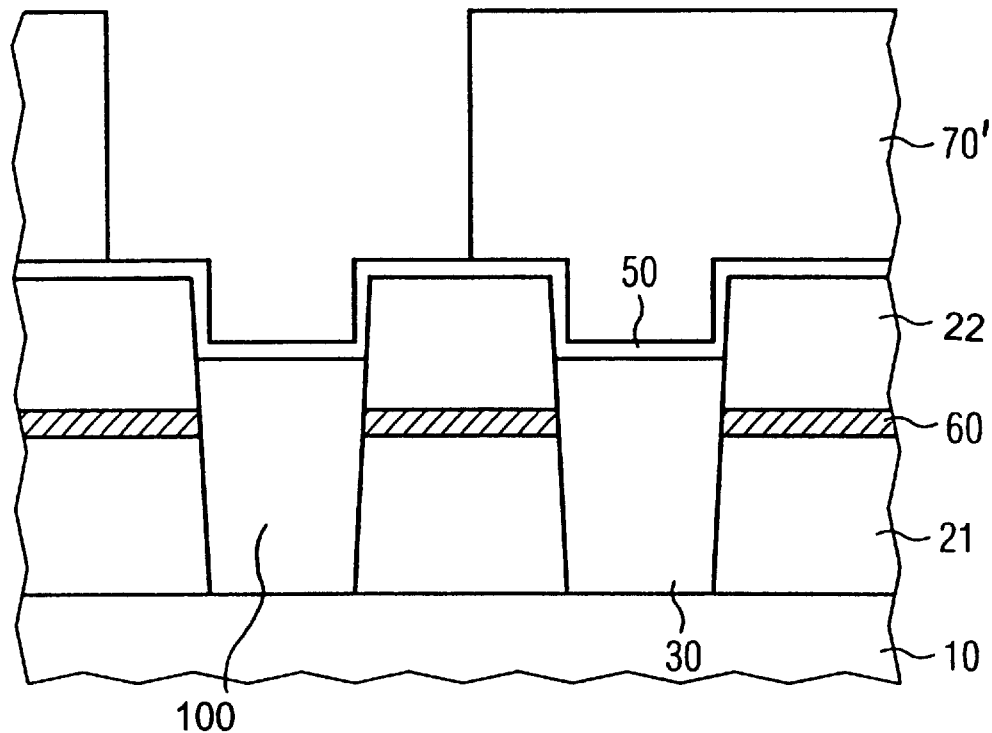
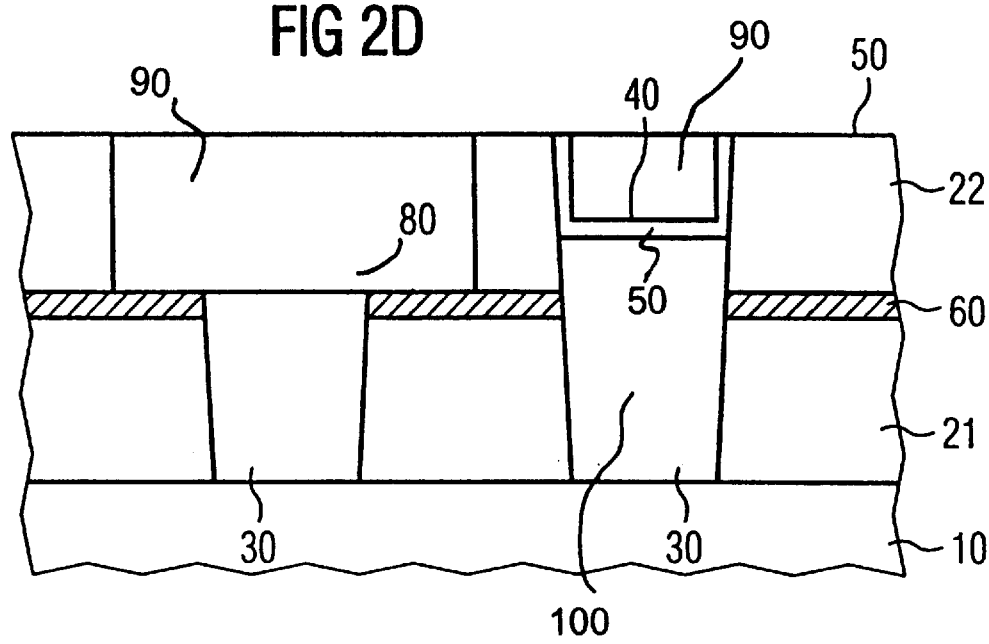

METHOD FOR FABRICATING A WIRING PLANE ON A SEMICONDUCTOR CHIP WITH AN ANTIFUSE

BACKGROUND OF THE INVENTION

Field of the Invention

The invention relates to a method for fabricating a wiring plane of switching elements on a semiconductor chip with an antifuse.

Antifuses are used as programmable components in integrated circuits in order to provide the user with the opportunity to program functions of the circuit himself. Furthermore, in semiconductor memories antifuses are used to provide circuit redundancy, i.e. in order, e.g. in the case of a data memory cell, to connect up a redundant memory cell by activation of the antifuse.

In this case, antifuses generally contain two electrically conductive contacts between which an insulating layer is introduced (e.g. U.S. Pat. No. 5,763,898). In this case, the material of the insulating layer is chosen such that it is destroyed by the action of energy, e.g. by radiating in a laser beam or applying a high voltage to the electrically conductive contacts, as a result of which a conductive connection is produced through the originally insulating layer and the two external conductive contacts are thus short-circuited. The antifuse can thus be switched from the off state to the on state in a manner programmed by the action of energy.

In this case, antifuses can be fabricated from a wide variety of electrically conductive materials as contacts and also from a wide variety of insulating intermediate layers disposed between the contacts. The antifuses are preferably fabricated, however, in the context of forming the metal planes in the semiconductor chip for wiring the switching elements of the integrated circuit or for connecting these components to the external connections of the semiconductor chip. In this case, the following process sequence is conventionally carried out in order to form antifuses in the context of metallization of the semiconductor chip. In order to fabricate the wiring plane, an oxide layer is coated on the semiconductor chip, contact holes to the components in the semiconductor chip being defined on the oxide layer by photolithography. At these contact points, the oxide is then removed preferably by chemical-physical dry etching. The uncovered contact holes are filled with a conductive material, e.g. polysilicon or a metal. The filling material is subsequently removed again by being etched back outside the contact holes, depressions being formed in the contact holes.

A dielectric layer, preferably silicon nitride, silicon dioxide or silicon oxynitride, is then deposited, on which the interconnects are defined in a further lithography process. During the lithography process, a photoresist containing two layers is applied to the dielectric layer by spinning. The two-layer photoresist contains a lower organic antireflection layer which may be a photoresist or resin thereof which is made highly light-absorbing by an absorber addition or by baking. The actually photochemically active photoresist layer is then applied to the organic antireflection layer. The lower organic antireflection layer serves to ensure that practically no light is reflected back from the semiconductor surface into the upper light-sensitive photoresist layer, thereby avoiding interference effects that prevent profile-exact transfer of the mask structure to the photoresist during exposure.

After exposure, the upper photoresist layer is developed, the irradiated regions of the photoresist are removed. The remaining photoresist regions serve as an etching mask for anisotropic etching of the organic antireflection layer, in order to transfer the structure produced in the upper photoresist layer to the dielectric layer situated under the organic antireflection layer. Afterward, in a next etching step during which the organic antireflection layer serves as a mask, the dielectric layer and parts of the underlying material are then removed, interconnect trenches thereby being produced. All of the remaining photoresist is then removed and a metallic material, primarily tungsten, is deposited on the surface in a large-area manner. The etched trenches which serve as interconnects and also the depressions—covered with a dielectric layer—in the remaining contact holes into which no interconnects were etched being filled. Afterward, the metallic material is then removed again outside the trenches and the depressions in the contact holes. The trenches filled with the conductive material serve as interconnects for wiring the components of the semiconductor chip, while the filled contact holes, with the dielectric layer situated between the conductive materials, are used as the antifuses.

In the conventional process sequence for fabricating antifuses in the context of metallization, it is necessary, as explained, to carry out two etching operations in order to form the interconnects, first the organic antireflection layer and then the underlying dielectric layer, which is required as the antifuse dielectric, being removed. During the operation of etching the organic antireflection layer, in particular the material deposited in the contact holes on the dielectric layer must also be reliably removed in the process, which is possible only by very precise process control. During the successive operations of etching the organic antireflection layer and the dielectric layer, care must furthermore be taken to ensure that compatibility between the different etching processes is achieved, otherwise the two etching operations have to be carried out in two different reaction chambers, thereby significantly increasing the fabrication costs.

SUMMARY OF THE INVENTION

It is accordingly an object of the invention to provide a method for fabricating a wiring plane on a semiconductor chip with an antifuse which overcomes the above-mentioned disadvantages of the prior art methods of this general type, which is distinguished by simple process control and low fabrication costs.

With the foregoing and other objects in view there is provided, in accordance with the invention, a fabrication method. The method includes the steps of providing a chip having a chip surface, applying a dielectric layer having a buried antireflection layer on the chip surface, photolithographically defining contact holes to be formed in the dielectric layer, etching the contact holes into the dielectric layer, applying a large-area application of a conductive material, removing the conductive material outside of the contact holes, forming depressions in the conductive material filling in the contact holes, applying a large-area application of an insulating layer, photolithographically defining interconnects to be formed in a region of some of the contact holes on the insulating layer, etching interconnect trenches into the insulating layer and the dielectric layer, applying a large-area application of a further conductive material, and removing the further conductive material from areas outside the interconnect trenches and the depressions. A combination of the further conductive material in the depressions, the insulating layer under the further conductive material and the conductive material under the insulating layer forming antifuses.

The process control for simultaneously forming the interconnects and the antifuses, which are both formed in the region of the depressions in the contact holes, makes it possible to carry out the etching of the interconnects in a single etching step. During which the insulating layer is removed in the region provided for the interconnects, thereby resulting in a simplified and cost-effective process progression. In this case, the antireflection layer buried in the dielectric layer reliably ensures that, during the photolithography for defining both the contact holes and the interconnects, interference effects are avoided during exposure.

In accordance with a preferred embodiment, the buried antireflection layer is composed of a light-absorbing inorganic material, preferably an oxynitride, and has a layer thickness of between 15 and 60 $\mu$m. The material can be incorporated particularly well as an intermediate layer into the dielectric, in particular an oxide, and be etched together with the dielectric.

In accordance with a further preferred embodiment, doped polysilicon is used as a material for filling the contact holes, silicon nitride is used for the insulating layer, and tungsten is used as the conductive material in the depressions of the contact holes. With this layer sequence, an antifuse with a breakdown voltage that can be set exactly can be reliably obtained with the aid of the known standard process control in the context of metallization.

Other features which are considered as characteristic for the invention are set forth in the appended claims.

Although the invention is illustrated and described herein as embodied in a method for fabricating a wiring plane on a semiconductor chip with an antifuse, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 2A to 2D are diagrammatic, partial cross-sectional views through the semiconductor chip for forming the interconnects and the antifuses in different stages of a process progression according to the invention.

DESCRIPTION OF THE PREFERRED EMBODIMENTS

Figure 1:
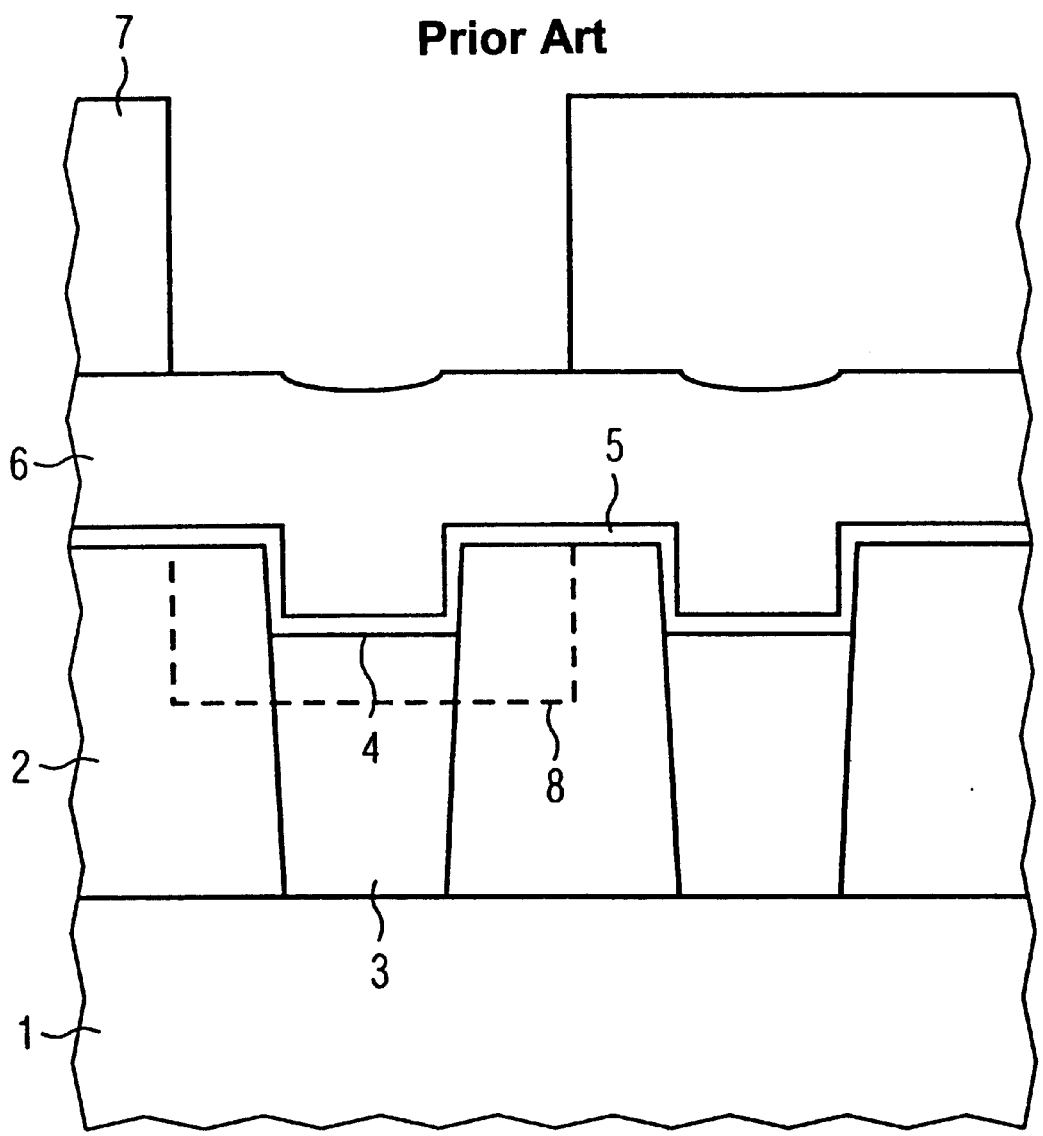
FIG. 1 is a diagrammatic, partial cross-sectional view through a semiconductor chip with a conventional photoresist construction for patterning an interconnect plane on a chip, antifuses being formed at the same time as the interconnects.

In all the figures of the drawing, sub-features and integral parts that correspond to one another bear the same reference symbol in each case. Referring now to the figures of the drawing in detail and first, particularly, to FIG. 1 thereof, there is shown a conventional process progression for forming antifuses in the context of fabricating a first metallization plane. A photolithography for defining the different structures is effected using a photoresist layer sequence containing a bottom organic antireflection layer and a photochemically active resist layer applied over the latter. In this case, the organic antireflection layer may be a photoresist or resin thereof which is made highly light-absorbing by an absorber addition or baking and thus ensures that practically no light is reflected back from the semiconductor surface into the upper photochemically active resist layer, thereby reliably avoiding interference effects during exposure of the resist.

In this case, the following layer construction results during an interconnect etching according to the conventional process progression. A thick silicon dioxide layer 2 is applied to a semiconductor chip 1. Contact holes 3 are patterned in the layer 2 in a previous lithography step, the contact holes 3 are filled with doped polysilicon as a conductive material. The contact holes 3 with the doped polysilicon have depressions 4 relative to an oxide surface which are produced by etching back the doped polysilicon. A thin silicon nitride layer 5 is applied as an additional dielectric layer over the silicon dioxide 2 and the doped polysilicon of the contact holes 3.

For the photolithography of the interconnects, the semiconductor chip 1 is then coated with resist, a resist construction with an organic antireflection layer 6 at the bottom and a photochemically active resist layer 7 at the top being formed. In order to define the interconnects, the photoresist system is exposed and developed in the regions provided therefor, the upper photochemically active layer 7 being stripped off in the interconnect regions. By contrast, the contact holes 3 provided for forming the antifuses continue to be masked by the complete photoresist system. In order then to pattern the interconnects on the semiconductor chip 1, in a first etching step the organic antireflection layer 6 is etched away by anisotropic etching, which is conventionally carried out with the aid of the reactive ion etching method, in order to transfer the interconnect structure to the underlying silicon nitride layer 5.

In a second etching step, the nitride layer 5 and part of the underlying oxide layer and of the polysilicon layer in the contact holes 3 is then etched away anisotropically in order to form trenches 8 for the interconnects (broken lines). Different etching gas compositions have to be used for the two etching steps, i.e. the etching away of the organic antireflection layer 6 and the subsequent nitride etching and oxide and polysilicon etching in order to form the trenches 8. Furthermore, it proves to be difficult, in particular, to effect a precise process control for etching away the entire material of the organic antireflection layer 6 over the nitride layer 5 in the depressions 4 of the contact holes 3. Using the conventional process control, it is therefore complex and thus expensive to fabricate the interconnect trenches.

In order to avoid the critical interconnect trench etching using two successive etching steps, the invention of the instant application uses a process sequence for combined fabrication of a first wiring plane and of the antifuses on the semiconductor chip 1 with a changed resist layer composition. FIGS. 2A–2D show individual process steps in the fabrication method according to the invention. The process sequence according to the invention starts with a deposition of a planarization layer 21 on a wafer surface 10. The planarization layer 21 is intended to eliminate edges and steps on the wafer surface 10, which are produced, in particular, by polysilicon gates of the components already patterned, before the application of a metallization. For the planarization, use is preferably made of doped glasses applied using reflow technology, primarily a phosphorus (PSG) or a borophosphorus (BPSG) doping being chosen. The deposition of these glasses is followed by a high-temperature step, which results in the flattening of steep edges on the wafer surface 1 on account of the surface tension of the molten glass and the production of a gently curved surface. As an alternative to the aforementioned doped glasses, it is also possible, in particular when the process temperature for melting the glasses would lead to damage to the underlying semiconductor components, to use other planarization layers, e.g. spin-on glasses.

A thin inorganic antireflection layer 60, which is preferably composed of oxynitride and has a thickness of 15 to 60 μm, is applied to the doped glass layer 21. The inorganic antireflection layer 60 is configured in such a way that the light which is used for the photolithography, and preferably lies in the ultraviolet region, is absorbed virtually completely in the layer 60. A dielectric layer 22, preferably silicon dioxide, is then deposited onto the inorganic antireflection layer 60, e.g. according to the TEOS method. As an alternative, however, it is also possible to incorporate the inorganic antireflection layer 60 as an intermediate layer into the dielectric layer 22.

Figure 2A:
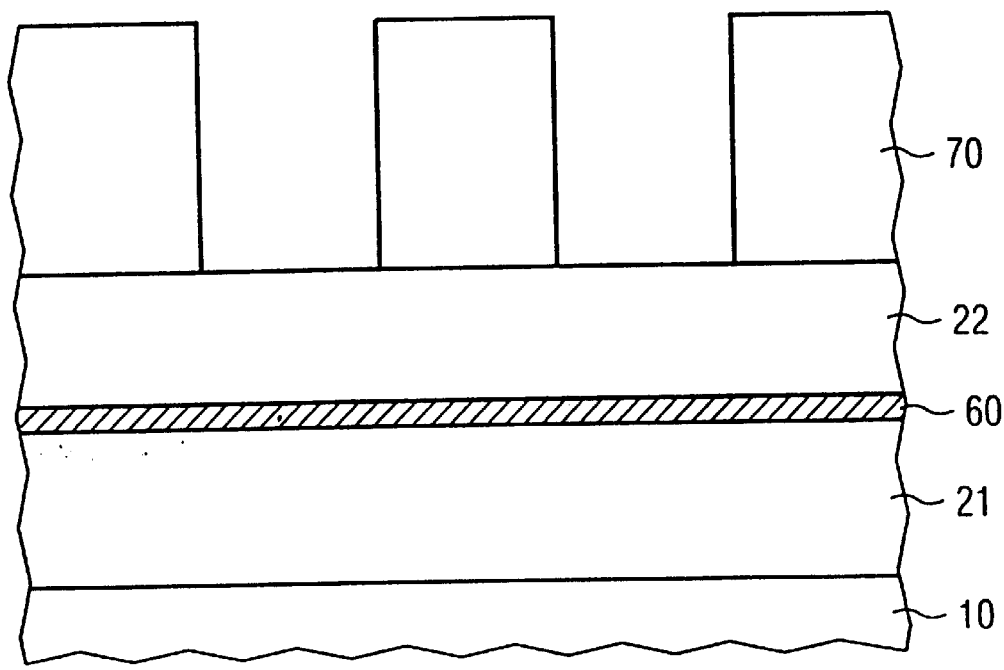

The silicon dioxide layer 22 is subsequently coated with a radiation-sensitive photoresist 70. In this case, customary photoresists are positive resists that essentially contain three constituents, namely a resin compound, which is responsible for layer formation, a photoactive compound and also a solvent. After the photoresist 70 has been applied by spinning, the solvent is driven out of the resist by preliminary baking. Afterward, the resist 70 is then exposed to a mask containing the pattern of the desired contact holes to the components on the semiconductor chip preferably as a chromium layer on a transparent support. During the exposure operation, the inorganic antireflection layer 60 provided as an intermediate layer under the silicon dioxide layer 22 ensures that practically no light is reflected back from the chip surface into the photoresist 70 and exposure-disturbing interference effects are thus reliably avoided. After exposure, the photoresist 70 is then developed, the irradiated regions being removed using alkaline solutions in the case of the positive resists that are conventionally used. Afterward, the resist is then hardened by post-baking in order to obtain the necessary resistance of the resist for the subsequent etching process. FIG. 2A shows the layer construction after this process step.

In order to open contact holes 30, anisotropic etching of the layer sequence containing the doped glass layer 21, the inorganic antireflection layer 60 and the silicon dioxide layer 22 is carried out, with the result that the structure produced in the photoresist 70 is transferred to the semiconductor chip surface 10 situated under the doped glass layer 21. In this case, the etching is preferably effected with the aid of chemical-physical dry etching, in particular according to the reactive ion etching method, which enables a high selectivity and a good anisotropy factor to be achieved.

During the etching operation, the remaining photoresist layer 70 serves as an etching mask.

Figure 2B:
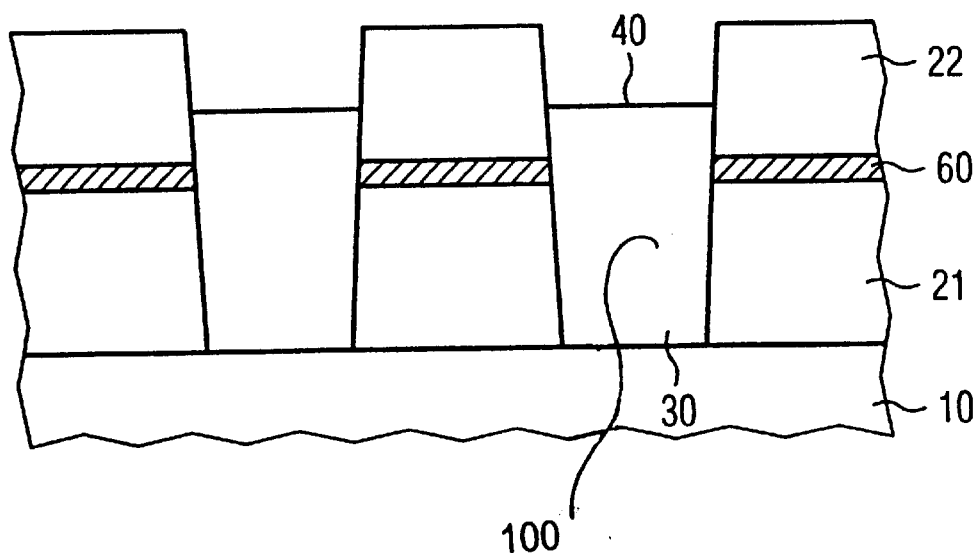

The photoresist layer 70 is then completely stripped off after the conclusion of the etching operation. The contact holes 30 are subsequently filled with a conductive material 100. The conductive material 100 used in this case is preferably doped polysilicon 100, which is particularly suitable for fabricating overlapping (borderless) contacts between different components on the semiconductor chip. However, it is also possible to use metals such as, e.g. tungsten or copper, instead of polysilicon. After the filling of the contact holes 30, the polysilicon layer 100 is removed outside the contact holes 30 by etching-back, the planarization being carried out in such a way as to produce depressions 40 in the region of the contact holes 30 relative to the surrounding silicon dioxide layer 22. FIG. 2B shows the fabrication process after the conclusion of this process step.

After the planarization of the polysilicon 100 in the contact holes 30, a silicon nitride layer 50 is deposited on the surface in a large-area manner. The silicon nitride layer 50 is electrically insulating and is used as a middle layer in the antifuse construction. Instead of silicon nitride, however, it is also possible to use a different electrically insulating material. In this case, the breakdown voltage for the switching of the antifuse from the off state to the on state can be defined by way of the thickness of the insulation layer 50 or the material used.

After the application of the silicon nitride layer 50, a further lithography process is then carried out in order to define the interconnects. For this purpose, a second light-sensitive photoresist layer 70' is applied to the silicon nitride layer 50 by spinning, and is then exposed using a mask containing the structure of the interconnects. The photoresist layer 70' is subsequently developed, as a result of which the photoresist layer 70' is removed at the exposed locations. FIG. 2C shows the layer construction after the hardening of the residual photoresist region that is effected after development. As is illustrated in FIG. 2C, the photoresist layer 70' has in this case been opened over the contact holes 30 which are intended to be connected via the interconnects. The contact holes 30, by contrast, in which the antifuses are intended to be formed, continue to be masked by the photoresist layer 70'.

In order to form interconnect trenches 80, an etching process is then once again carried out, preferably using chemical-physical dry etching technology, during which process the photoresist layer 70' serves as an etching mask. In this case, first the silicon nitride layer 50 and then the underlying silicon dioxide layer 22 are etched away anisotropically, the inorganic antireflection layer 60 serving as an etching stop. During this operation, the filled-in polysilicon 100 is also partly removed in the region of the contact holes 30. The etching operation constitutes a known standard process that is preferably carried out with the aid of reactive ion etching.

After the conclusion of the etching operation, the photoresist layer 70' is then completely eliminated and a thin adhesion-promoter intermediate layer and a metal layer 90 are coated on the uncovered surface in a large-area manner, the interconnect trenches 80 produced by the etching and also the depressions 40 present over the contact holes 30 on the silicon nitride layer 50 being filled. In this case, titanium is preferably used as the adhesion promoter and tungsten is preferably used as the metal. The adhesion-promoter layer and the metal layer 90 are removed again outside the trenches 80 and the depressions 40, preferably by chemical mechanical polishing, resulting in a planar surface. The layer construction after this process step is shown in FIG. 2D.

Not only are the interconnects which are connected to the components on the semiconductor chip via the contact holes 30 but also the antifuses have then been produced in the semiconductor chip. The antifuses are formed by the contact holes 30, in which the insulating silicon nitride layer 50 is still present between the doped polysilicon layer 100 and the overlying metal layer 90.

With the process sequence according to the invention, then, in the context of forming a wiring plane, at the same time it is possible to form the antifuses which, as programmable components, provide the user with the opportunity of personally actuating functions on the semiconductor chip by activating the antifuses, i.e. applying a breakdown voltage. The process sequence presented can also be employed repeatedly, with the result that it is possible to implement a multilayer wiring with the antifuses in the different planes.

We claim:

1. A fabrication method, which comprises the steps of:

providing a chip having a chip surface;

applying a dielectric layer having a buried antireflection layer on the chip surface;

photolithographically defining contact holes to be formed in the dielectric layer;

etching the contact holes into the dielectric layer;

applying a large-area application of a conductive material and removing the conductive material outside of the contact holes;

forming depressions in the conductive material filling in the contact holes;

applying a large-area application of an insulating layer;

photolithographically defining interconnects to be formed in a region of some of the contact holes on the insulating layer;

etching interconnect trenches into the insulating layer and the dielectric layer;

applying a large-area application of a further conductive material; and removing the further conductive material from areas outside the interconnect trenches and the depressions, a combination of the further conductive material in the depressions, the insulating layer under the further conductive material and the conductive material under the insulating layer forming antifuses.

2. The method according to claim 1, which comprises using a light-absorbing inorganic material as the buried antireflection layer.

3. The method according to claim 1, which comprises setting a thickness of the buried antireflection layer to be between 15 and 60 $\mu$m.

4. The method according to claim 1, which comprises forming the insulating layer from silicon nitride.

5. The method according to claim 1, which comprises:

using doped polysilicon as the conductive material for filling the contact holes; and using tungsten as the further conductive material for filling the interconnect trenches and the depressions.

6. The method according to claim 1, which comprises using oxynitride as a material for forming the buried antireflection layer.

* * * * *